United States Patent
Osterberg et al.

(10) Patent No.: US 11,946,890 B2
(45) Date of Patent: Apr. 2, 2024

(54) METHOD FOR MEASURING HIGH RESISTIVITY TEST SAMPLES USING VOLTAGES OR RESISTANCES OF SPACINGS BETWEEN CONTACT PROBES

(71) Applicant: KLA Corporation, Milpitas, CA (US)

(72) Inventors: Frederik Westergaard Osterberg, Hellerup (DK); Kristoffer Gram Kalhauge, Kongens Lyngby (DK); Mikkel Fougt Hansen, Kongens Lyngby (DK)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 17/743,417

(22) Filed: May 12, 2022

(65) Prior Publication Data

US 2022/0373491 A1 Nov. 24, 2022

Related U.S. Application Data

(60) Provisional application No. 63/192,102, filed on May 24, 2021.

(30) Foreign Application Priority Data

Nov. 10, 2021 (EP) ...................... 21207513

(51) Int. Cl.
*G01N 27/04* (2006.01)
(52) U.S. Cl.
CPC .................. *G01N 27/041* (2013.01)

(58) Field of Classification Search
CPC .... G01N 27/041; G01R 27/025; G01R 27/16; G01R 31/2648; G01R 31/2831
See application file for complete search history.

(56) References Cited

U.S. PATENT DOCUMENTS

| 6,927,569 | B2 | 8/2005 | Worledge et al. |
| 2008/0100289 | A1 | 5/2008 | Zimmer et al. |
| 2008/0164872 | A1 | 7/2008 | Worledge |
| 2008/0294365 | A1* | 11/2008 | Hansen ................ G01R 27/08 |
| | | | 324/715 |
| 2010/0023287 | A1 | 1/2010 | Worledge et al. |
| 2010/0072993 | A1 | 3/2010 | Pan |
| 2014/0252356 | A1* | 9/2014 | Wang ..................... H01L 22/34 |
| | | | 257/48 |

(Continued)

FOREIGN PATENT DOCUMENTS

WO 2020205236 A1 10/2020

OTHER PUBLICATIONS

WIPO, International Search Report for International Application No. PCT/US2022/030447, dated Sep. 8, 2022.

(Continued)

*Primary Examiner* — Jay Patidar
(74) *Attorney, Agent, or Firm* — Hodgson Russ LLP

(57) ABSTRACT

To measure the resistance area product of a high resistivity layer using a microscopic multi point probe, the high resistivity layer is sandwiched between two conducting layers. A plurality of electrode configurations/positions is used to perform three voltage or resistance measurements. An equivalent electric circuit model/three layer model is used to determine the resistance area product as a function of the three measurements.

15 Claims, 2 Drawing Sheets

(56) References Cited

U.S. PATENT DOCUMENTS

2019/0310295 A1   10/2019   Osterberg et al.

OTHER PUBLICATIONS

D. W. Abraham et al., "Rapid-turnaround characterization methods for MRAM development," IBM Journal of Research and Development, Jan. 2006, pp. 55-67, vol. 50, No. 1.

Lin et al., "Junction leakage measurements with micro four-point probes," AIP Conference Proceedings, 2012, pp. 175-178, vol. 1496, No. 1.

* cited by examiner

METHOD FOR MEASURING HIGH RESISTIVITY TEST SAMPLES USING VOLTAGES OR RESISTANCES OF SPACINGS BETWEEN CONTACT PROBES

CROSS-REFERENCE TO RELATED APPLICATIONS

This application claims priority to European Patent App. No. 21207514 filed Nov. 10, 2021 and U.S. App. No. 63/192,102 filed May 24, 2021, the disclosures of which are hereby incorporated by reference.

FIELD OF THE DISCLOSURE

The present disclosure relates to measuring/determining an electric property, such as the resistance area product, of a multilayer test sample like a semiconductor wafer. Specifically, the disclosure includes measuring/determining the resistance area product of a layer having a high resistivity (i.e. that is a poor conductor).

BACKGROUND OF THE DISCLOSURE

It is desirable to perform the electric property measurements using a microscopic multi point probe. This is a probe having a plurality of contact probes for contacting the test sample such that a current may be injected into the test sample, and with a pitch between the contact probes in the micrometer range. However, establishing an electric connection between the contact probes and the high resistivity layer may be difficult. Using a macroscopic probe is also not possible because the probe contact points are too large or may damage the sample.

It is known to use microscopic multi point probes to measure tunnel junctions and determine electric properties of the tunnel junctions by means of an equivalent circuit model, such as in U.S. Pat. No. 6,927,569. However, such a test sample is a three-layer test sample. Thus, it is not a test sample that comes with a bottom conducting layer and a top insulating/high resistivity layer. Furthermore, a tunnel junction test sample is not a test sample having a high resistivity layer, because there is no ohmic transport of electrons in the tunnel barrier.

SUMMARY OF THE DISCLOSURE

To achieve the object of measuring the resistance area product of a high resistivity layer of a test sample using a microscopic multi point probe, an electrically conducting top layer is added to the test sample on top of the high resistivity layer such that the test sample has a three layer structure comprising the high resistivity layer sandwiched between a top and bottom conducting layers. The resistance area product is determined using an equivalent circuit model having as inputs the value of the injected currents and measured voltages or resistances.

A first aspect of the disclosure is a method for determining an electric property, such as the resistance area product, of a multilayer test sample. The multilayer test sample has a bottom layer constituting an electrical conducting or semi-conducting layer (e.g., a wafer substrate), an interface layer, and a top layer constituting an electrical conducting or semiconducting layer. The interface layer is arranged between the bottom layer and the top layer and has a smaller electrical conductivity than the bottom layer and the top layer and also has a thickness such that the interface layer substantially constitutes an ohmic conductor and electron transport through the interface layer by means of quantum tunneling is negligible (e.g., less than 1% of the total transport of electrons through the interface layer). This electron transport through the interface layer may be masked by measurement noise. The method includes providing the test sample, providing a microscopic multi point probe having a set of contact probes for contacting the top layer, contacting the top layer with the set of contact probes, and measuring a plurality of voltages or resistances for each of a plurality of spacings of contact probes. A pair of contact probes are used for each resistance or voltage measurement. A model for determining the resistance area product of the interface layer is provided. The model receives the plurality of voltages or resistances as input and returns the resistance area product as output. The resistance area product is determined by means of the model.

The top layer may be provided by depositing it on top of the interface layer/high resistivity layer if it is not already provided such that the microscopic multi point probe may land on the top conducting layer and an electric contact may be established. The top layer may be a metal or a semiconducting layer. The top layer may also be referred to as a top electrode.

The interface layer/high resistivity layer may, for example, be an oxide layer on top of the wafer or materials such as High-k, indium gallium zinc oxide (IGZO) or a phase change material (PCM). Other materials are possible.

For an ohmic conductor, the current through it is directly proportional to the voltage across it (i.e., following Ohm's law). A tunnel barrier is not an ohmic conductor. However, transport of electrons by means of quantum mechanical tunneling cannot be ruled out, but the transport of electrons by means of quantum mechanical tunneling will be negligible for the materials that are to be measured meaning that it will be so small that measurement noise will increase it. Thus, it is not possible to measure because there is too low a signal to noise ratio in the measurement.

A contact probe is also known as a pin/electrode. The contact probes may have each probe tip/end of probe positioned along a line having equal spacing/pitch between each tip (e.g., a colinear equidistant probe).

Specifically, three different pin/contact probe configurations may be used. For example, for the first current injection/measurement, the two outermost pins may be used to inject the current and the two innermost pins may be used for the voltage measurement.

For the second current injection, the two outer left pins may be used to inject the current, and the two outer right pins may be used to measure the voltage.

For the third current injection, the outermost pin together with the center pin may be used to inject the current (i.e., with a voltage pin in between).

For the three measurements to be mathematical independent, a probe having at least five pins can be used.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

The disclosure will now be explained in more detail below by means of examples. The disclosure may, however, be embodied in different forms than depicted below, and should not be construed as limited to any examples set forth herein. Rather, any examples are provided so that the disclosure will be thorough and complete, and will fully convey the scope of the disclosure to those skilled in the art.

Figure 1:
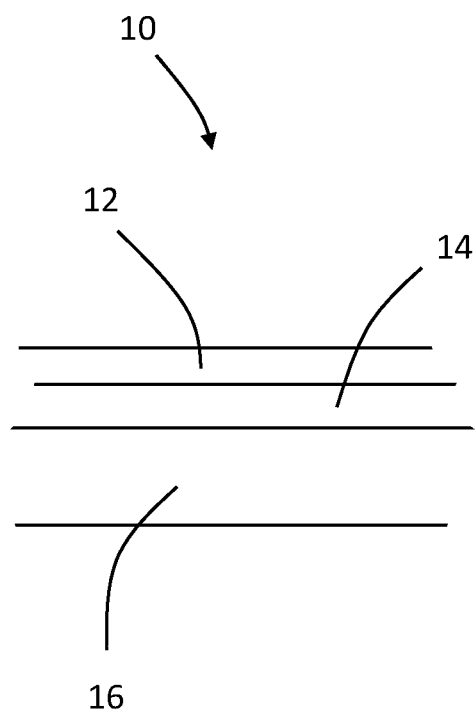
FIG. 1 shows an exemplary wafer with three layers.

FIG. 1 shows a wafer 10 with three layers. A top layer 12, which may be tungsten, is deposited on the interface layer 14, which is the layer to be measured. A wafer substrate 16 constitutes the bottom layer.

In general, the top layer 12 should be an easy to contact metallic material such as Ru, W or TiN. The sheet resistance of the top layer 12 can be three times larger than the sheet resistance of the bottom layer or a bottom electrode. This sheet resistance can provide desired measurement results.

The bottom layer may be the wafer substrate 16 or a layer on top of the wafer substrate 16. The bottom layer can be made of Ru, W, TiN, or doped Si.

The interface layer 14 can have a resistance area product greater than 1000 ohm*μm^2. For example, the resistance area product of the interface layer 14 can be greater than 10 megaohm*μm^2, 100 megaohm*μm^2, or 1000 megaohm*μm^2.

To provide desired measurement results, the interface layer 14 can have a thickness greater than 2 nm and an electrical conductivity of less than 10 times an electrical conductivity of the bottom layer or the top layer 12. Other resistance area products, thicknesses, and conductivities are possible. These are merely examples.

A normal microscopic four-point measurement on such material stacks provides a sheet resistance, which in a three-layer model is a combination of the sheet resistances of the top and bottom layers and the resistance-area product (RA) of the interface layer. These parameters define the transfer length (designated L or λ), which is a characteristic lateral length scale for the current transport in the sample.

Depending on the ratio of the probe pitch to L, the results of the four-point probe measurements can differ substantially. Typically, small probe pitches mainly probe the top layer and large probe pitches mainly probe the parallel resistance of the top and bottom layers.

Measurements at a range of probe pitches around λ are needed to pin-point the properties of all three layers.

In an embodiment, values of L range between 100 μm and 300 μm (micrometer). If either the top or bottom layer of the stack has a resistance several times (e.g., >5) higher than the other then a measurement with a 1000 μm pitch will have a low sensitivity to the high resistance layer. Additionally, such a measurement also will have a low sensitivity to the highly resistive interface layer. Therefore, such measurements can be unreliable to monitor process variations in multilayer stacks unless all layers have similar resistances.

Figure 2A:
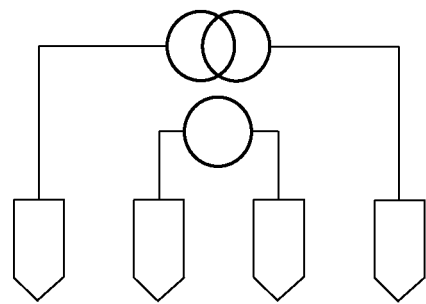
FIGS. 2*a*-2*c* show configurations of current and voltage pins of the probe.
Figure 2B:
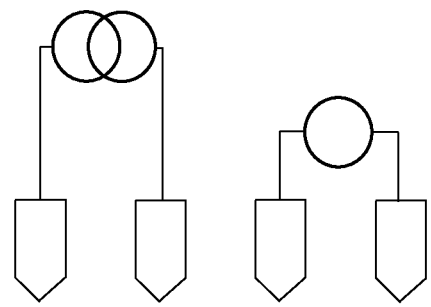
Figure 2C:
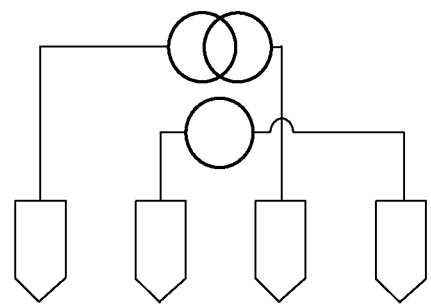

FIGS. 2a-2c show three distinct configurations of the current and voltage pins of the probe. Here only four pins are shown. A voltmeter is shown as a single circle circuit symbol and a current source is shown as a double circle circuit symbol. Each contact probe/pin is shown as a rectangular arrow circuit symbol. While four probes/pins are shown, more or fewer probes/pins are possible. In an instance, more than four probes/pins are used.

The probe can have a distance between neighboring contact probes of at least 4 μm, though other dimensions are possible. In an instance, the probe has a distance between a two outermost contact probes of less than 3 mm.

In the following, it is assumed that no in-plane current runs in the interface layer, which is equivalent to the interface layer having a high resistivity and being thin compared to the top and bottom layers. The bottom layer should be more than 100 times better conducting than the interface layer for the assumption to hold and be able to use the model presented below.

When a probe is engaged on the multilayer sample it will measure a combination of the resistance of the bottom layer (Rb) and top layer (Rt) and the interface's resistance-area product (RA=rho*t), where rho and t are the resistivity and thickness of the interface layer, respectively.

In an example, the contact probes can be landed on the electrical conducting or semiconducting layer or on a contact pad connected to the electrical conducting or semiconducting layer. The electrical conducting or semiconducting layer can be in the top layer 12.

For a colinear equidistant probe (i.e., a probe with all electrodes on a line and with an equal spacing), the resistance measured in an A, B and C configuration is defined by the following model.

$$R_A = \frac{R_t R_b}{R_t + R_b} \frac{1}{2\pi} \left[ \frac{R_t}{R_b} \left( 2K_0\left(\frac{s}{\lambda}\right) - 2K_0\left(\frac{2s}{\lambda}\right) \right) + \ln 4 \right],$$

$$R_B = \frac{R_t R_b}{R_t + R_b} \frac{1}{2\pi} \left[ \frac{R_t}{R_b} \left( K_0\left(\frac{s}{\lambda}\right) - K_0\left(\frac{3s}{\lambda}\right) \right) + \ln 3 \right],$$

$$R_C = \frac{R_t R_b}{R_t + R_b} \frac{1}{2\pi} \left[ \frac{R_t}{R_b} \left( K_0\left(\frac{s}{\lambda}\right) - 2K_0\left(\frac{2s}{\lambda}\right) + K_0\left(\frac{3s}{\lambda}\right) \right) + \ln \frac{4}{3} \right].$$

$R_A$ is the resistance measured with the probe in the configuration shown in FIG. 2a.

$R_B$ is the resistance measured with the probe in the configuration shown in FIG. 2b.

$R_C$ is the resistance measured with the probe in the configuration shown in FIG. 2c.

$K_0(x)$ is the Bessel function of the second kind of zeroth order, s is the electrode pitch and λ is the characteristic length given by the following equation.

$$\lambda = \sqrt{\frac{RA}{R_t + R_b}}$$

The resistance area product is related to the sheet resistance as follows.

$$R_{SQ} = \frac{RA}{t^2}$$

The model may then be solved numerically for the resistance area product (RA) of the interface layer. Thus, the resistance area product of the interface layer is determined as a function of the resistance measurements. Alternatively, instead of inputting the measured resistances, the value of the injected currents and measured voltages may be inputted because the resistance is the voltage over current.

In an embodiment, injecting a first current is injected into said test sample by means of a first pair of contact probes of said set of contact probes. A second current is injected into said test sample by means of a second pair of contact probes of said set of contact probes. A third current is injected into said test sample by means of a third pair of contact probes of said set of contact probes. The first pair of contact probes, second pair of contact probes, and third pair of contact probes have a distance between them. These distances can be the same or different depending on the probes that make up the pair.

A controller can be coupled to and in electronic communication with the probe. The controller typically comprises a programmable processor, which is programmed in software and/or firmware to carry out the functions that are described herein, along with suitable digital and/or analog interfaces for connection to the other elements of system. Alternatively or additionally, the controller comprises hardwired and/or programmable hardware logic circuits, which carry out at least some of the functions of the controller. In practice, the controller may comprise multiple, interconnected control units, with suitable interfaces for receiving and outputting the signals that are described herein. Program code or instructions for the controller to implement various methods and functions disclosed herein may be stored in readable storage media, such as a memory in the controller or other memory.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method for determining an electric property of a multilayer test sample comprising:
    providing said multilayer test sample, wherein said multilayer test sample includes:
        a bottom layer constituting a first electrical conducting or semiconducting layer;
        an interface layer;
        a top layer constituting a second electrical conducting or semiconducting layer, wherein said interface layer is arranged between said bottom layer and said top layer, wherein said interface layer has a smaller electrical conductivity than said bottom layer and said top layer; and wherein said interface layer has a thickness such that said interface layer substantially constitutes an ohmic conductor and such that electron transport through said interface layer by means of quantum tunneling is negligible compared to a total transport of electrons through said interface layer;
    providing a microscopic multi point probe, said microscopic multi point probe having a set of contact probes for contacting said top layer;
    contacting said top layer with said set of contact probes;
    measuring a plurality of voltages or resistances for each of a plurality of spacings of contact probes, wherein a pair of contact probes are used for each resistance or voltage measurement;
    providing a model for determining a resistance area product of said interface layer, wherein said model receives said plurality of voltages or resistances as input and returns said resistance area product as output; and
    determining said resistance area product by means of said model.

2. The method according to claim 1, wherein said electron transport through said interface layer by means of quantum tunneling is masked by measurement noise.

3. The method according to claim 1, wherein said electron transport through said interface layer by means of quantum tunneling is less than 1% of said total transport of electrons through said interface layer.

4. The method according to claim 1, further comprising:
    injecting a first current into said test sample with a first pair of contact probes of said set of contact probes, said first pair of contact probes having a first distance between them;
    injecting a second current into said test sample with a second pair of contact probes of said set of contact probes, said second pair of contact probes having a second distance between them; and
    injecting a third current into said test sample with a third pair of contact probes of said set of contact probes, said third pair of contact probes having a third distance between them.

5. The method according to claim 1, further comprising landing said set of contact probes on said second electrical conducting or semiconducting layer or on a contact pad connected to said second electrical conducting or semiconducting layer.

6. The method according to claim 1, wherein said set of contact probes comprises more than four contact probes.

7. The method according to claim 1, wherein said first electrical conducting or semiconducting layer constitutes a wafer substrate.

8. The method according to claim 1, wherein said semiconducting layer in said bottom layer is a wafer substrate.

9. The method according to claim 1, wherein said interface layer has a resistance area product greater than 1000 ohm*μm^2.

10. The method according to claim 9, wherein said resistance area product is greater than 10 megaohm*μm^2.

11. The method according to claim 1, wherein said microscopic multi point probe has a distance between neighboring contact probes of at least 4 μm.

12. The method according to claim 11, wherein said microscopic multi point probe has a distance between a two outermost of said contact probes of less than 3 mm.

13. The method according to claim 1, wherein said interface layer has a thickness greater than 2 nm.

14. The method according to claim 1, wherein said interface layer has an electrical conductivity of less than 10 times an electrical conductivity of said bottom layer or said top layer.

15. The method according to claim 1, wherein said model constitutes an electrical equivalent circuit of said first electrical conducting or semiconducting layer, said interface layer, and said second electrical conducting or semiconducting layer.

* * * * *